(12) United States Patent
Yang et al.

(10) Patent No.: US 8,835,899 B2
(45) Date of Patent: Sep. 16, 2014

(54) GRAPHENE ELECTRONIC DEVICE AND METHOD OF FABRICATING THE SAME

(71) Applicant: Samsung Electronics Co., Ltd., Suwon-Si (KR)

(72) Inventors: Hee-jun Yang, Seoul (KR); Sun-ae Seo, Hwaseong-si (KR); Sung-hoon Lee, Hwaseong-si (KR); Hyun-jong Chung, Hwaseong-si (KR); Jin-seong Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/957,602

(22) Filed: Aug. 2, 2013

(65) Prior Publication Data

US 2013/0313512 A1 Nov. 28, 2013

Related U.S. Application Data

(62) Division of application No. 13/067,254, filed on May 19, 2011, now Pat. No. 8,592,799.

(30) Foreign Application Priority Data

Oct. 1, 2010 (KR) .................. 10-2010-0095971

(51) Int. Cl.
| | | |
|---|---|---|
| *H01L 29/06* | (2006.01) | |
| *H01L 29/66* | (2006.01) | |
| *H01L 29/786* | (2006.01) | |
| *B82Y 10/00* | (2011.01) | |
| *H01L 29/78* | (2006.01) | |
| *H01L 29/10* | (2006.01) | |
| *B82Y 40/00* | (2011.01) | |
| *H01L 29/16* | (2006.01) | |

(52) U.S. Cl.
CPC .... *H01L 29/66477* (2013.01); *H01L 29/66045* (2013.01); *H01L 29/78603* (2013.01); *H01L 29/78684* (2013.01); *H01L 29/78606* (2013.01); *H01L 29/66742* (2013.01); *B82Y 10/00* (2013.01); *H01L 29/78* (2013.01); *H01L 29/1079* (2013.01); *B82Y 40/00* (2013.01); *H01L 29/1606* (2013.01); *Y10S 977/734* (2013.01); *Y10S 977/842* (2013.01); *Y10S 977/838* (2013.01)
USPC ................ 257/9; 257/E29.242; 257/E21.411; 977/734; 977/842; 977/838

(58) Field of Classification Search
CPC .... B82Y 10/00; B82Y 20/00; H01L 29/0665; H01L 54/0048
USPC .............. 257/9, E29.242, E21.411; 977/734, 977/842, 928
See application file for complete search history.

(56) References Cited

U.S. PATENT DOCUMENTS

| | | | |
|---|---|---|---|
| 7,297,621 B2 | 11/2007 | Brandon | |
| 7,368,009 B2 | 5/2008 | Okada et al. | |
| 2005/0277234 A1 | 12/2005 | Brandon | |
| 2010/0065826 A1 | 3/2010 | Takimiya et al. | |
| 2010/0264403 A1* | 10/2010 | Sirringhaus et al. | 257/24 |
| 2011/0006837 A1* | 1/2011 | Wang et al. | 327/539 |
| 2011/0042649 A1 | 2/2011 | Duvall et al. | |
| 2011/0143101 A1 | 6/2011 | Sandhu | |

FOREIGN PATENT DOCUMENTS

| | | |
|---|---|---|
| JP | 2008-205272 A | 9/2008 |
| JP | 2009-164432 A | 7/2009 |
| JP | 2009-277803 A | 11/2009 |
| KR | 2009-0132874 A | 12/2009 |

OTHER PUBLICATIONS

Lafkioti et al., "Graphene on a Hydrophobic Substrate: Doping Reduction and Hysteresis Suppression under Ambient Conditions", Received for review: Sep. 24, 2009, Published on Web: Mar. 10, 2010, Nano Lett. 2010, 10, 1149-1153.

\* cited by examiner

*Primary Examiner* — Timor Karimy
(74) *Attorney, Agent, or Firm* — Harness, Dickey & Pierce, P.L.C.

(57) ABSTRACT

A graphene electronic device and a method of fabricating the graphene electronic device are provided. The graphene electronic device may include a graphene channel layer formed on a hydrophobic polymer layer, and a passivation layer formed on the graphene channel layer. The hydrophobic polymer layer may prevent or reduce adsorption of impurities to transferred graphene, and a passivation layer may also prevent or reduce adsorption of impurities to a heat-treated graphene channel layer.

4 Claims, 4 Drawing Sheets

# GRAPHENE ELECTRONIC DEVICE AND METHOD OF FABRICATING THE SAME

CROSS-REFERENCE TO RELATED APPLICATIONS

This is a divisional application of U.S. application Ser. No. 13/067,254, filed May 19, 2011, which claims priority under 35 U.S.C. §119 to Korean Patent Application No. 10-2010-0095971, filed on Oct. 1, 2010, in the Korean Intellectual Property Office (KIPO), the entire contents of each of which is incorporated herein by reference.

BACKGROUND

1. Field

Example embodiments relate to graphene electronic devices in which a passivation layer is formed on a graphene channel layer and methods of fabricating the same.

2. Description of the Related Art

Graphene, having a 2-dimensional hexagonal carbon structure, is a new alternative to other types of semiconductors. Graphene is a zero-gap semiconductor. In addition, carrier mobility of graphene is 100,000 $cm^2V^{-1}s^{-1}$ at room temperature, which is about 100 times that of silicon. Due to such characteristics, graphene may be used in high-speed devices, for example, a radio frequency (RF) device.

When graphene is formed to have a channel width equal to or less than 10 nm, that is, when a graphene nano-ribbon (GNR) is formed, a band gap is formed due to a size effect. The GNR enables fabrication of a field effect transistor (FET) that is operable at room temperature.

A graphene electronic device refers to an electronic device using graphene, for example, a FET or a RF transistor.

Regarding graphene electronic devices, when graphene is treated, impurities may be included in graphene, thereby affecting characteristics of graphene. In addition, even after impurities are removed from graphene, graphene may also be contaminated when exposed to an air atmosphere. Accordingly, electronic devices using graphene may not achieve their desired characteristics.

SUMMARY

Provided are methods of fabricating a graphene electronic device in which a passivation layer is formed on a graphene channel layer after the graphene channel layer is heat treated under vacuum conditions to remove impurities therefrom.

Provided also are methods of fabricating a graphene electronic device in which a gate oxide layer is formed on a graphene channel layer after the graphene channel layer is heat treated under vacuum conditions to remove impurities therefrom.

Provided is a graphene electronic device which includes a passivation layer on a graphene channel layer and a graphene electronic device which includes a gate oxide on a graphene channel layer.

Additional aspects will be set forth in part in the description which follows and, in part, will be apparent from the description, or may be learned by practice of the presented embodiments.

In accordance with example embodiments, a graphene electronic device may include a substrate configured to act as a gate electrode, a gate oxide on the conductive substrate, a hydrophobic polymer on the gate oxide, a graphene channel layer on the hydrophobic polymer, a source electrode on one end of the graphene channel layer and a drain electrode on another end of the graphene channel layer, and a passivation layer covering the graphene channel layer exposed by the source electrode and the drain electrode.

In accordance with example embodiments, a graphene electronic device may include a substrate, a hydrophobic polymer on the substrate, a graphene channel layer on the hydrophobic polymer, a source electrode on one end of the graphene channel layer and a drain electrode on another end of the graphene channel layer, a gate oxide covering the graphene channel layer exposed by the source electrode and the drain electrode, and a gate electrode on a portion of the graphene channel layer between the source electrode and the drain electrode.

In accordance with example embodiments, a method of fabricating a graphene electronic device may include forming a gate oxide on a silicon substrate (the silicon substrate being configured to act as a gate electrode, forming a hydrophobic polymer on the gate oxide, forming a graphene layer on the hydrophobic polymer, patterning the graphene layer to form a graphene channel layer, forming a source electrode on one end of the graphene channel layer and a drain electrode on another end of the graphene channel layer, annealing a resultant structure under a vacuum condition, and forming a passivation layer covering the graphene channel layer.

In accordance with example embodiments, a method of fabricating a graphene electronic device may include forming a hydrophobic polymer on a substrate, forming a graphene channel layer on the hydrophobic polymer, annealing a resultant structure under a vacuum condition, forming a gate oxide covering the graphene channel layer, forming a source electrode and a drain electrode on ends of the graphene channel layer, and forming a gate electrode on a portion of the graphene channel layer between the source electrode and the drain electrode.

In accordance with example embodiments, a graphene electronic device may include a conductive substrate acting as a gate electrode, a gate oxide disposed on the conductive substrate, a hydrophobic polymer disposed on the gate oxide, a graphene channel layer disposed on the hydrophobic polymer, a source electrode and a drain electrode respectively disposed on ends of the graphene channel layer, and a passivation layer covering the graphene channel layer exposed by the source electrode and the drain electrode.

The hydrophobic polymer may be hexamethyldisilazane (HMDS).

The hydrophobic polymer may have a thickness of about 10 nm to about 100 nm.

The passivation layer may include silicon oxide.

The passivation layer may have a thickness of about 10 nm to 100 nm.

The graphene channel layer may include mono-layer or bi-layer graphene.

In accordance with example embodiments, a graphene electronic device may include a substrate, a hydrophobic polymer disposed on the substrate, a graphene channel layer disposed on the hydrophobic polymer, a source electrode and a drain electrode respectively disposed on ends of the graphene channel layer, a gate oxide covering the graphene channel layer exposed by the source electrode and the drain electrode, and a gate electrode formed on a portion of the graphene channel layer between the source electrode and the drain electrode.

In accordance with example embodiments, a method of fabricating a graphene electronic device may include forming a gate oxide on a silicon substrate acting as a gate electrode, forming a hydrophobic polymer on the gate oxide, forming a graphene layer on the hydrophobic polymer, forming a source electrode and a drain electrode spaced apart from the source electrode on the graphene layer, patterning the graphene layer to form a graphene channel layer so that the source electrode and the source drain are respectively disposed on ends of the graphene channel layer, annealing a resultant structure under a vacuum condition, and forming a passivation layer covering the graphene channel layer.

The annealing may be performed at a pressure of about $10^{-5}$ to about $10^{-7}$ Torr and at a temperature of about 150 to about 250° C.

In accordance with example embodiments, a method of fabricating a graphene electronic device may include forming a hydrophobic polymer on a substrate, forming a graphene channel layer on the hydrophobic polymer, annealing a resultant structure under a vacuum condition; forming a gate oxide covering the graphene channel layer, forming a source electrode and a drain electrode respectively formed on ends of the graphene channel layer, and forming a gate electrode on a portion of the graphene channel layer between the source electrode and the drain electrode.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
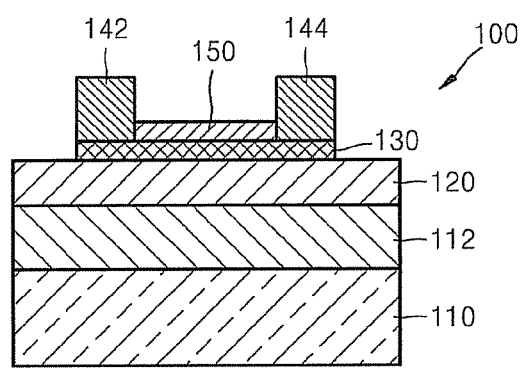
FIG. 1 is a schematic sectional view of a graphene electronic device according to example embodiments.

Example embodiments will now be described more fully with reference to the accompanying drawings in which example embodiments are shown. The inventive concepts may, however, be embodied in different forms and should not be construed as limited to example embodiments set forth herein. Rather, example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to example embodiments which are illustrated in the accompanying drawings, wherein the thicknesses of layers and regions are exaggerated for clarity. Throughout the specification, like reference numerals refer to like elements, and any detailed description presented will not be repeatedly provided.

FIG. 1 is a schematic sectional view of a graphene electronic device 100 according to example embodiments.

Referring to FIG. 1, a gate oxide 112 may be formed on a silicon substrate 110. The gate oxide 112 may be silicon oxide and may be formed to have a thickness of about 100 nm to about 300 nm. The silicon substrate 110 is a conductive substrate and is also referred to as a gate electrode.

A hydrophobic polymer layer 120 may be formed on the gate oxide 112. The hydrophobic polymer layer 120 may be formed of hexamethyldisilazane (HMDS) and may be formed to have a thickness of about 10 nm to about 100 nm. If the thickness of the hydrophobic polymer layer 120 is equal to or less than 10 nm, current leakage may occur. If the thickness of the hydrophobic polymer layer 120 is equal to or greater than 100 nm, a gate voltage may be increased, and a capacitance between source and drain electrodes and a gate electrode may be increased.

A graphene channel layer 130 is formed on the hydrophobic polymer layer 120. To form the graphene channel layer 130, graphene is transferred on the hydrophobic polymer layer 120 via chemical vapor deposition (CVD) and the graphene is patterned. The graphene channel layer 130 may consist of mono-layer or bi-layer graphene. The hydrophobic polymer layer 120 may allow graphene to be easily transferred and may prevent or reduce adsorption of volatile materials, for example, water molecules, to the graphene.

A source electrode 142 and a drain electrode 144 may be formed on ends of the graphene channel layer 130, respectively. A passivation layer 150 may cover the graphene channel layer 130 between the source electrode 142 and the drain electrode 144. The passivation layer 150 may be formed of silicon oxide. The passivation layer 150 may be formed to have a thickness of about 5 nm to about 30 nm.

The graphene electronic device 100 of FIG. 1 is a bottom gate-type transistor.

If a width of the graphene channel layer 130 is in a range of about 1 nm to about 20 nm, the graphene channel layer 130 may have a band gap due to a size effect of the graphene and thus has a semi-conductive property. Accordingly, the graphene electronic device 100 of FIG. 1 may act as a field effect transistor (FET). A FET including the graphene channel layer 130 is operable at room temperature.

In example embodiments, if the width of the graphene channel layer 130 is equal to or greater than about 100 nm, the graphene channel layer 130 may act as a conductor and may have carrier mobility of 100,000 $cm^2V^{-1}s^{-1}$ at room temperature, which is about 100 times that of silicon. A graphene electronic device including the graphene channel layer 130 may act as a radio frequency (RF) transistor.

Figure 2:
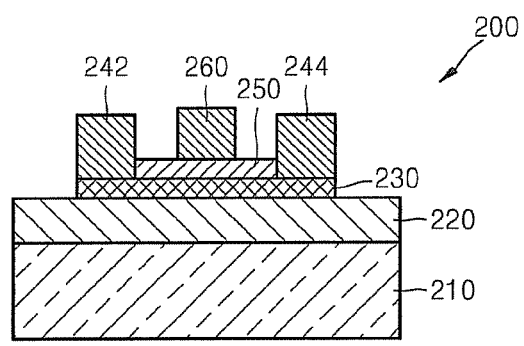
FIG. 2 is a schematic sectional view of a graphene electronic device according to example embodiments.

FIG. 2 is a schematic sectional view of a graphene electronic device 200 according to example embodiments.

Referring to FIG. 2, a hydrophobic polymer layer 220 may be formed on a substrate 210. The hydrophobic polymer layer 220 may be formed of hexamethyldisilazane (HMDS). A graphene channel layer 230 may be formed on the hydrophobic polymer layer 220. To form the graphene channel layer 230, a CVD graphene may be transferred on the hydrophobic polymer layer 230 and then patterned. The graphene channel layer 230 may consist of mono-layer or bi-layer graphene.

The hydrophobic polymer layer 220 may allow graphene to be easily transferred and may prevent or reduce adsorption of volatile materials, for example, water molecules, to graphene.

A source electrode 242 and a drain electrode 244 may be formed on ends of the graphene channel layer 230, respectively. A gate oxide 250 covering the graphene channel layer 230 may be formed on a portion of the graphene channel layer 230 between the source electrode 242 and the drain electrode 244. The gate oxide 250 may be silicon oxide. The gate oxide 250 may be formed to have a thickness of about 5 nm to about 30 nm. In example embodiments, a gate electrode 260 may be formed on the gate oxide 250 and between the sour electrode 242 and the drain electrode 244.

The graphene electronic device 200 of FIG. 2 is a top gate-type transistor.

If a width of the graphene channel layer 230 is in a range of about 1 nm to about 20 nm, the graphene channel layer 230 may have a band gap due to a size effect and thus shows a semi-conductive property. Accordingly, the graphene electronic device 200 of FIG. 2 may act as a FET. A FET including the graphene channel layer 230 is operable at room temperature.

In example embodiments, if the width of the graphene channel layer 230 is equal to or greater than about 100 nm, the graphene channel layer 230 may act as a conductor and may have carrier mobility of 100,000 $cm^2V^{-1}s^{-1}$ at room temperature, which is about 100 times that of silicon. A graphene electronic device including the graphene channel layer 230 may act as a RF transistor.

In the graphene electronic devices according to example embodiments, a passivation layer or a gate oxide may be formed on a graphene channel layer to protect unique characteristics of the graphene channel layer.

Hereinafter, methods of fabricating the graphene electronic devices, according to example embodiments, will be described in detail.

Figure 3A:
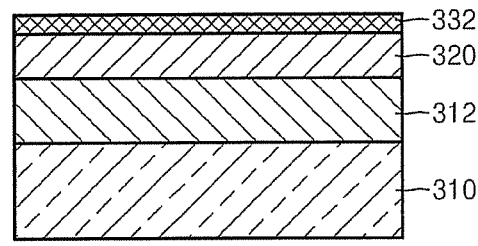
FIGS. 3A through 3C are side views for explaining a method of fabricating a graphene electronic device, according to example embodiments.
Figure 3B:
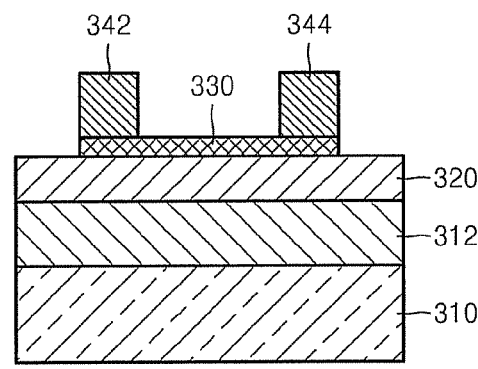
Figure 3C:
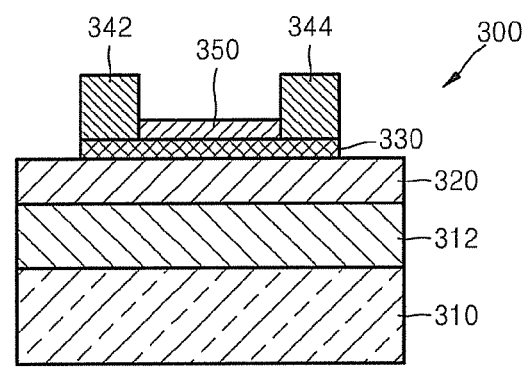

FIGS. 3A through 3C are side views for explaining a method of fabricating a graphene electronic device 300 according to example embodiments.

Referring to FIG. 3A, a gate oxide 312 may be formed on a silicon substrate 310. The silicon substrate 310 may be a conductive substrate doped with impurities and may act as a gate electrode. The gate oxide 312 may be silicon oxide formed by thermally oxidizing the silicon substrate 310, and may have a thickness of about 100 nm to about 300 nm A hydrophobic polymer layer 320 may be formed on the gate oxide 312. The hydrophobic polymer layer 320 may be formed of hexamethyldisilazane (HMDS) using chemical vapor deposition (CVD) and may be formed to have a thickness of about 10 nm to about 100 nm. If the thickness of the hydrophobic polymer layer 320 is equal to or less than 10 nm, current leakage may occur. If the thickness of the hydrophobic polymer layer 320 is equal to or greater than 100 nm, a gate voltage may be increased and a capacitance between source and drain electrodes and a gate electrode may be increased A graphene layer 332 may be transferred to the hydrophobic polymer layer 320. The graphene layer 332 may be a CVD graphene. The graphene layer 322 may consist of mono-layer or bi-layer graphene.

Referring to FIG. 3B, a source electrode 342 and a drain electrode 344 may be formed spaced apart from each other on the graphene layer 332.

The graphene layer 332 may be patterned to form a graphene channel layer 330. If a width of the graphene channel layer 330 is in a range of about 1 nm to about 20 nm, the graphene channel layer 330 may have a band gap due to a size effect and thus may show a semi-conductive property. Accordingly, the graphene electronic device 300 may act as a FET. A FET including the graphene channel layer 330 may be operable at room temperature.

In example embodiments, if the width of the graphene channel layer 330 is equal to or greater than about 100 nm, the graphene channel layer 330 may act as a conductor and may have carrier mobility of 100,000 $cm^2V^{-1}s^{-1}$ at room temperature, which is about 100 times that of silicon. A graphene electronic device including the graphene channel layer 330 may act as a RF transistor.

As shown in FIG. 3B, the source electrode 342 and the drain electrode 344 may be formed on ends of the graphene channel layer 330.

Referring to FIG. 3C, the resultant structure is heat treated under vacuum conditions. The vacuum conditions may be in a range of about $10^{-5}$ to about $10^{-7}$ Torr, and the heat treatment is performed by annealing at a temperature of about 150 to about 250° C. for 2 or more hours. Due to the vacuum heat treatment, water molecules and chemical materials adsorbed to the graphene channel layer 330 may evaporate, thereby allowing the graphene channel layer 330 to retain its unique characteristics.

In example embodiments, a passivation layer 350 may be deposited on the graphene channel layer 330. The passivation layer 350 may be formed of silicon oxide and may be formed to have a thickness of about 10 nm to about 100 nm. If the thickness of the passivation layer 350 is equal to or less than 10 nm, the graphene channel layer 330 may be doped with other materials and thus its unique characteristics may be damaged. If the thickness of the passivation layer 350 is equal to or greater than 100 nm, the size of the graphene electronic device 300 may be increased.

According to example embodiments, a hydrophobic polymer layer may allow a graphene layer to be easily transferred thereto, and may suppress adsorption of a volatile material, for example, water molecules, to the graphene layer.

Also, since a patterned graphene channel layer may be heat treated under vacuum conditions to remove water molecules from the graphene channel layer and the passivation layer may be formed on the graphene channel layer, the graphene channel layer may retain its unique characteristics.

FIGS. 4A through 4E are side views for explaining a method of fabricating a graphene electronic device 400 according to example embodiments.

Figure 4A:
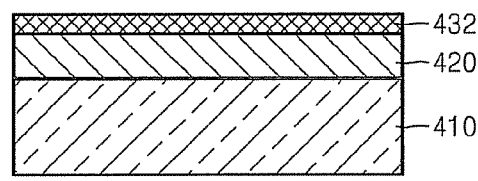
FIGS. 4A through 4C are side views for explaining a method of fabricating a graphene electronic device, according to example embodiments.

Referring to FIG. 4A, a hydrophobic polymer layer 420 may be formed on a substrate 410. The substrate 410 may be an insulating substrate or a conductive substrate. The hydrophobic polymer layer 420 may be formed of hexamethyldisilazane (HMDS) using chemical vapor deposition.

A graphene layer 432 may be transferred to the hydrophobic polymer layer 420. The graphene layer 432 may be a CVD graphene. The graphene layer 432 may consist of mono-layer or bi-layer graphene.

Figure 4B:
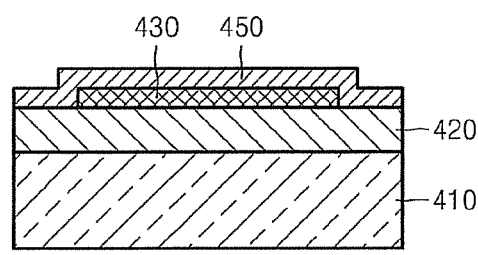

Referring to FIG. 4B, the graphene layer 432 may be patterned to form a graphene channel layer 430. If a width of the graphene channel layer 430 is in a range of about 1 nm to about 20 nm, the graphene channel layer 430 may have a band gap due to a size effect and thus may have a semi-conductive property. Accordingly, the graphene electronic device 400 may act as a FET. A FET including the graphene channel layer 430 may be operable at room temperature.

In example embodiments, if the width of the graphene channel layer 430 is equal to or greater than about 100 nm, the graphene channel layer 430 may act as a conductor and may have carrier mobility of 100,000 $cm^2V^{-1}s^{-1}$ at room temperature, which is about 100 times that of silicon. The graphene electronic device 400 including the graphene channel layer 430 may act as a RF transistor.

The resultant structure may be heat treated under vacuum conditions. The vacuum conditions may be in a range of about $10^{-5}$ to about $10^{-7}$ Torr, and the heat treatment may be performed by annealing at a temperature of about 150 to about 250° C. for 2 or more hours. Due to the vacuum heat treatment, water molecules and chemical materials adsorbed to the graphene channel layer 430 may evaporate, thereby allowing the graphene channel layer 430 to retain its unique characteristics.

A gate oxide layer 450 covering the graphene channel layer 430 may be formed on the hydrophobic polymer layer 420. The gate oxide layer 450 may be formed of silicon oxide. The gate oxide layer 450 may protect the graphene channel layer 430 that is heat treated under vacuum conditions.

Figure 4C:
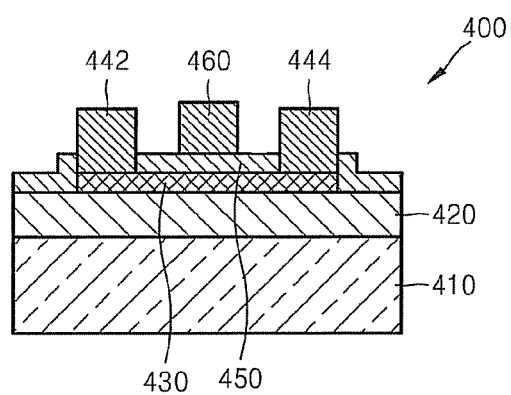

FIG. 4C, the gate oxide layer 450 is patterned to expose ends of the graphene channel layer 430 and a source electrode 442 and a drain electrode 444 are respectively formed on the exposed ends of the graphene channel layer 430. In example embodiments, a gate electrode 460 may be formed on a portion of the graphene channel layer 430 between the source electrode 442 and the drain electrode 444. In example embodiments, the source electrode 442, the drain electrode 444, and the gate electrode 460 may be simultaneously formed.

In accordance with example embodiments, since a graphene layer may be transferred to a hydrophobic polymer layer, the graphene layer may be easily transferred, and adsorption of a volatile material, for example, water molecules, to the graphene layer may be suppressed.

Also, water molecules may be removed from the graphene channel layer by annealing the graphene channel layer under vacuum conditions, and the gate oxide layer may be used as a passivation layer for protecting the graphene channel layer.

Figure 5:
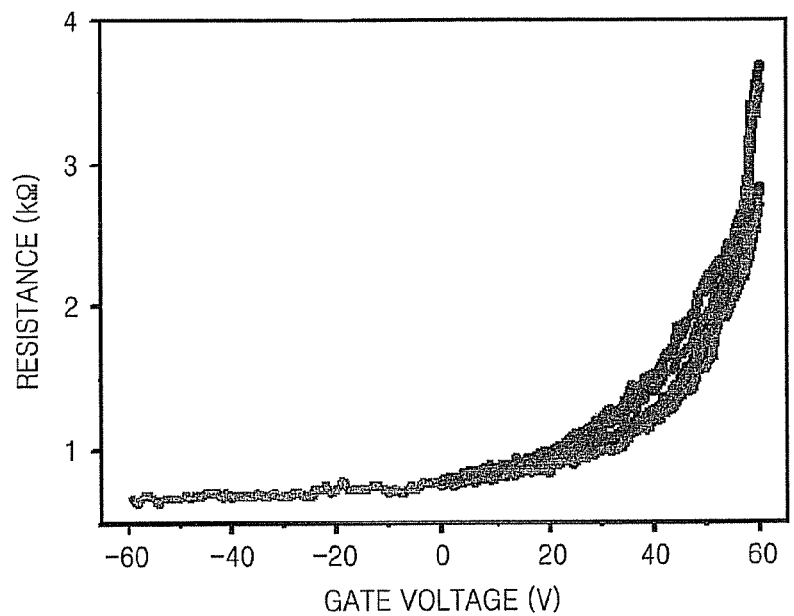
FIG. 5 is a graph showing electrical characteristics of a conventional transistor including a graphene channel layer.
Figure 6:
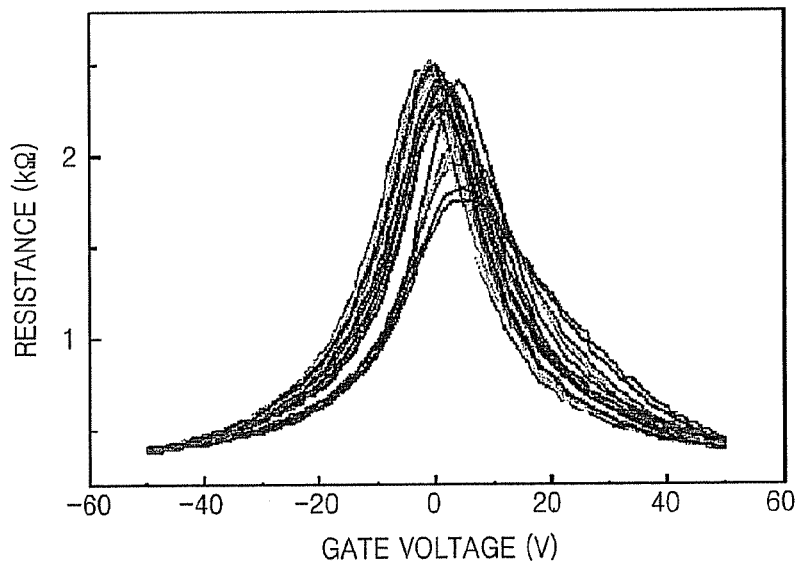
FIG. 6 is a graph showing electrical characteristics of a transistor according to example embodiments.

FIG. 5 is a graph showing electrical characteristics of a conventional transistor including a graphene channel layer, and FIG. 6 is a graph showing electrical characteristics of a transistor according to example embodiments.

Referring to FIG. 5, in a conventional transistor, impurities may be adsorbed to the graphene channel layer and thus, the graphene channel layer may have a relatively high resistance at room temperature and thus carrier mobility may be low. Also, a Dirac point is equal to or higher than 60 V and thus, a gate voltage is increased.

In example embodiments, as shown in FIG. 6, the graphene channel layer has a relatively low resistance at room temperature and thus carrier mobility is high. Also, a Dirac point is near 0 V and thus, ON/OFF control is easy to perform.

According to example embodiments, because a passivation layer or a gate oxide is formed on the graphene channel layer after the graphene channel layer is heat treated, adsorption of water molecules or other volatile materials to the graphene channel layer may be prevented or reduced.

It should be understood that example embodiments described herein should be considered in a descriptive sense only and not for purposes of limitation. Descriptions of features or aspects within example embodiments should typically be considered as available for other similar features or aspects in other embodiments.

What is claimed is:

1. A graphene electronic device comprising:
   a substrate;
   a hydrophobic polymer directly on the substrate;
   a graphene channel layer directly on the hydrophobic polymer;
   a source electrode on one end of the graphene channel layer and a drain electrode on another end of the graphene channel layer;

a gate oxide covering the graphene channel layer exposed by the source electrode and the drain electrode; and a gate electrode on a portion of the graphene channel layer between the source electrode and the drain electrode.

2. The graphene electronic device of claim 1, wherein the hydrophobic polymer is hexamethyldisilazane (HMDS).

3. The graphene electronic device of claim 1, wherein the graphene channel layer comprises a mono-layer or bi-layer graphene.

4. The graphene electronic device of claim 1, wherein the hydrophobic polymer has a thickness of about 10 nm to about 100 nm.

* * * * *